United States Patent
Ubukata (10) Patent No.: US 6,434,178 B1
(45) Date of Patent: Aug. 13, 2002

(54) SEMICONDUCTOR LASER (75) Inventor: Akinori Ubukata, Tokyo (JP)

(73) Assignee: Nippon Sanso Corporation, Tokyo (JP)

(*) Notice: Subject to any disclaimer, the term of this patent is extended or adjusted under 35 U.S.C. 154(b) by 0 days.

(21) Appl. No.: 09/308,232

(22) PCT Filed: Sep. 21, 1998

(86) PCT No.: PCT/JP98/04240
§ 371 (c)(1),
(2), (4) Date: May 20, 1999

(87) PCT Pub. No.: WO99/16156
PCT Pub. Date: Apr. 1, 1999

(30) Foreign Application Priority Data

Sep. 24, 1997 (JP) ................................. 9-259124

(51) Int. Cl.[7] ................................. H01S 5/00
(52) U.S. Cl. ........................... 372/45; 372/43
(58) Field of Search .................... 372/43, 45

(56) References Cited

U.S. PATENT DOCUMENTS 5,251,225 A * 10/1993 Eglash et al. .................. 372/45
5,764,668 A * 6/1998 Ishizaka et al. ............... 372/45

FOREIGN PATENT DOCUMENTS

| JP | Hei 04-218994 | 8/1992 |
| JP | Hei 06-209139 | 7/1994 |
| JP | Hei 09-092936 | 4/1997 |

OTHER PUBLICATIONS

Nippon Sanso Corporation Technical Report, No. 15, pp. 13–18, published on Nov. 30, 1996.

* cited by examiner

Primary Examiner—Paul Ip
Assistant Examiner—James Menefee
(74) Attorney, Agent, or Firm—Oblon, Spivak, McClelland, Maier & Neustadt, P.C.

(57) ABSTRACT

A semiconductor laser which can emit at high output, for which the threshold current and efficiency have a low temperature dependence. In GaInAs/GaInAsP semiconductor lasers, the lower the holding temperature, the higher the slope efficiency. As the operation temperature rises, and the threshold current becomes larger, the loss coefficient increases. As a result, external quantum efficiency falls and output drops. Accordingly, in order to enable applications in broad technical fields, the semiconductor laser emits at high output, for which the threshold current and efficiency have a low temperature dependence. The semiconductor laser includes a compressively strained quantum well semiconductor laser employing GaInAs/GaInAsP, carrier blocking layers are provided in a p-type waveguide layer and n-type waveguide layer having a band gap which is larger than the band gap of a smallest band gap of the waveguide layers.

4 Claims, 3 Drawing Sheets

SEMICONDUCTOR LASER

BACKGROUND OF THE INVENTION

1. Field of the Invention

The present invention relates to a strained quantum well laser that emits at high output, and has a low temperature dependence of efficiency and threshold current. More specifically, the present invention relates to a compressively strained quantum well semiconductor laser employing GaInAs/GaInAsP, in which a carrier blocking layer has been formed.

This application is based on Japanese Patent Application No. Hei 9-259124 filed in Japan, the content of which is incorporated herein by reference.

2. Discussion of the Background

GaInAs/GaInAsP is one of the most important semiconductor laser materials. In particular, an InGaAs/InGaAsP semiconductor laser having quantum wells in the active layer has been put into practical use as a communications light source in the wavelength band from 1.3 μm to 1.55 μm. In order to emit at wavelengths of 1.6 μm or higher employing this material, a compressively strained quantum well semiconductor laser is known in which the active layer is the compressively strained layer.

Figure 4:
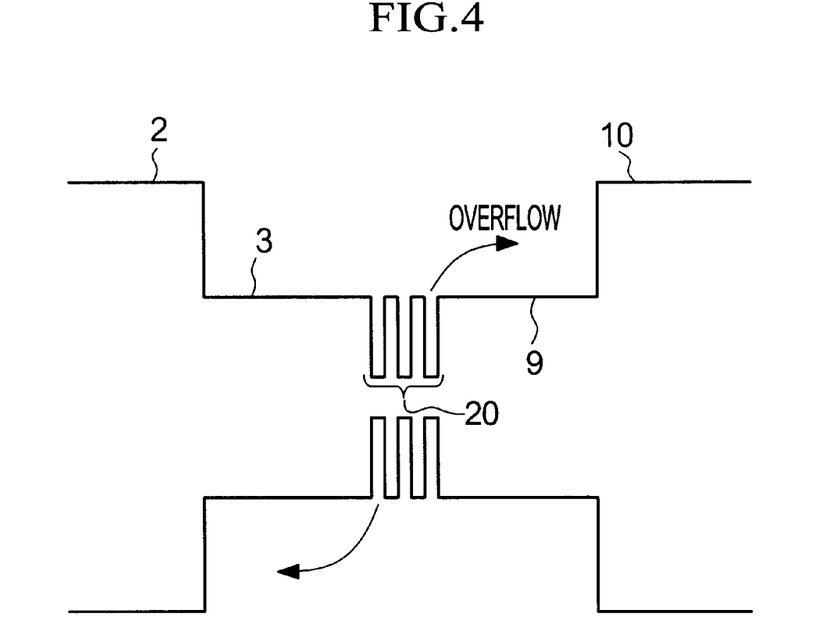
FIG. 4 is a schematic view for explaining band gap in a conventional semiconductor laser.
Figure 5:
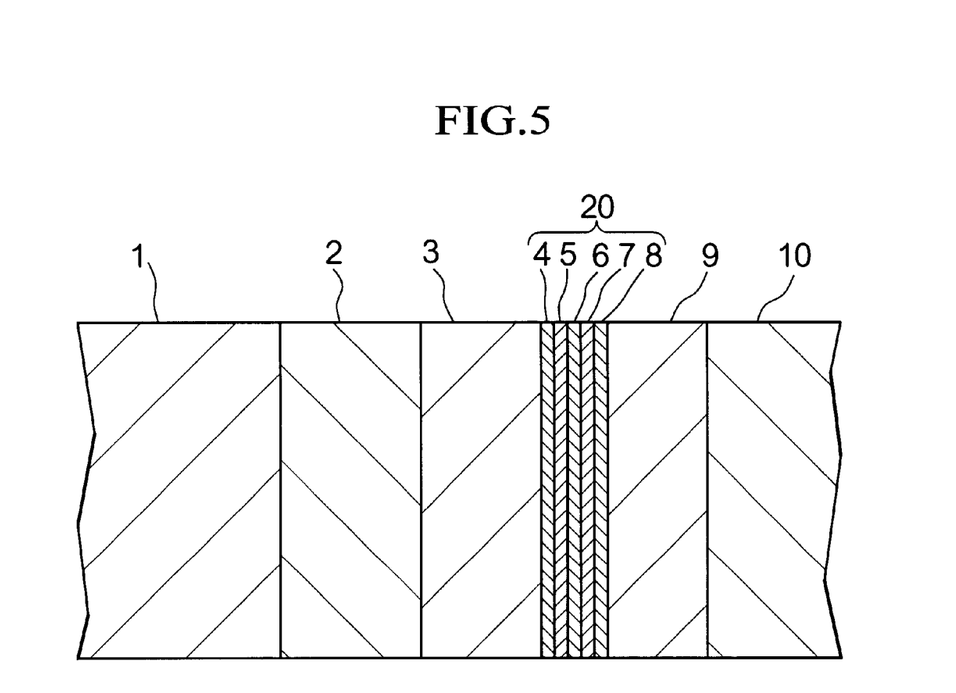
FIG. 5 is a component cross-sectional view showing the multiple layer in a conventional semiconductor laser.

FIG. 4 shows the band structure in a conventional InGaAs/InGaAsP compressively strained quantum well semiconductor laser for the case where there are three quantum well layers. FIG. 5 shows the multiple layer in this semiconductor laser.

In the design of this conventional semiconductor laser, a p-type cladding layer 2 (p-InP) is layered onto a substrate consisting of p-type InP. Next, sequentially layered on top of p-type cladding layer 2 are a p-type waveguide layer 3 (p-GaInAsP); $Ga_xIn_{1-x}As$ first quantum well layer 4; GaInAsP barrier layer 5; $Ga_xIn_{1-x}As$ second quantum well layer 6; GaInAsP barrier layer 7; $Ga_xIn_{1-x}As$ third quantum well layer 8; n-GaInAsP waveguide layer 9; and an n-type cladding layer 10 (n-InP). The portion from $Ga_xIn_{1-x}As$ first quantum well layer 4 through $Ga_xIn_{1-x}As$ third quantum well layer 8 forms active layer 20.

In order to expand laser applications in medical instruments, manufacturing, and spectroscopy, as well as in optical sources for fiber communications, it is desirable that the above-described InGaA/InGaAsP semiconductor laser emit at high output and have a low temperature dependence of threshold current and efficiency.

For example, laser spectroscopy is an analysis method for measuring the gas concentration by irradiating the gas to be analyzed with semiconductor laser light of a specific wavelength band, and then detecting the amount of absorption by the specific gas components in the analyzed gas at a light receiving member. When sweeping the emission wavelength by varying the holding temperature of the semiconductor laser light source, the threshold current and slope efficiency are extremely important causative factors. Namely, the lower the holding temperature, the higher the slope efficiency and the smaller the threshold current. At the same time, the loss coefficient increases as the temperature rises. As a result, the external quantum efficiency drops and output falls. For this reason, it is desirable that the light source of the spectrometer have a low temperature dependence within the temperature range of 20~50° C., without a change in the slope efficiency and threshold current.

The phenomenon of carrier overflow may be cited as the primary reason for deterioration in the temperature characteristics of a semiconductor laser and hindrance to achieving a higher output. In carrier overflow, recombination of electrons and holes injected into the active layer region cannot keep pace when an extremely high current is injected. As a result, electrons overflow into the region of waveguide layers 3,9 which has a larger band gap than active layer 20. The majority of electrons which overflow due to this type of phenomenon are consumed uselessly as heat loss. In addition, due to a rise in component temperature, carrier leakage increases exponentially. As a result, laser output cannot be increased and injection efficiency falls.

A Separated Confinement Heterostructure (SCH) employing quantum wells such as shown in FIG. 4 has been employed in order to improve the circumstances described above and prevent carrier overflow. Namely, a weak waveguide laser structure having a thin active layer has been investigated, with a focus on separating and confining light and carriers, or on reducing the laser power density. In addition, in order to improve the characteristic temperature, investigations have also been made into the use of compounds including Al in the active layer, and of a Grated Index Separated Confinement Heterostructure (GRIN structure), and the like.

However, when oscillating an InGaAs/InGaAsP semiconductor laser at a wavelength of 1.6 μm or higher, the characteristic temperature (temperature dependent coefficient for threshold value) is at best 60K.

On the other hand, in case of emitting a semiconductor laser at high power, a method is known for introducing a carrier blocking layer into the active layer so that carrier overflow upon high injection of the carrier is prevented. For example, Japanese Patent Application, First Publication No. Hei 7-23139 discloses a semiconductor laser which emits at ~1 μm employing AlGaAs in which a carrier blocking layer has been introduced.

However, it is thought that the characteristics of the semiconductor laser may be effected by introduction of a carrier blocking layer, depending on the thickness of the layer. In other words, if the carrier blocking layer is made thin, on the order of 1~2 nm, the injected electrons are expected to easily transmit through the carrier blocking layer. Accordingly, an improvement in carrier overflow from this type of design cannot be readily anticipated. This is because, an electron tunneling effect may occur in the case of a thin blocking layer. If the blocking layer is extremely thin, the effect from the tunneling effect is extremely large. As a result, function as a blocking layer deteriorates. However, when the blocking layer is extremely thick the injection efficiency becomes very poor. This leads to an increase in the threshold current as a result, so that continuous emission at room temperature may no longer be possible. Based on these circumstances, then, it is believed that there is an optimal value for the thickness of the carrier blocking layer.

An evaluation based on temperature characteristics is performed as one indicator which prevents the carrier overflow phenomenon. In particular, there has been strong demand for improvement in temperature characteristics in InP optical devices.

SUMMARY OF THE INVENTION

As discussed above, there has been a desire in the various fields mentioned for a technique for further improving the temperature dependence of threshold current and efficiency in semiconductor lasers.

The present invention has as its objective the provision of a semiconductor laser which can emit at high output, for which the threshold current and efficiency have a low temperature dependence.

The present invention's semiconductor laser is characterized in that, in a compressively strained quantum well semiconductor laser employing GaInAs/GaInAsP, carrier blocking layers are provided in the p-type and n-type waveguide layers having a band gap Egc which is larger than the band gap Egb of the waveguide layers, these carrier blocking layers being formed of a material having a refractive index which is smaller than the waveguide layer.

The thickness of the carrier blocking layers is preferably 5~10 nm.

In the case of a 1.74 $\mu$m semiconductor laser, it is preferable that the band gap difference between the waveguide layer and the carrier blocking layer at room temperature be in the range of 85 meV~190 meV.

It is also preferable that the band gap difference between the band gap energy (Ego) of the fist ground state level in the quantum well layer and the band gap (Egc) of the carrier blocking layer be in the range of 300~500 meV.

DETAILED DESCRIPTION OF THE PREFERRED EMBODIMENTS

Figure 1:
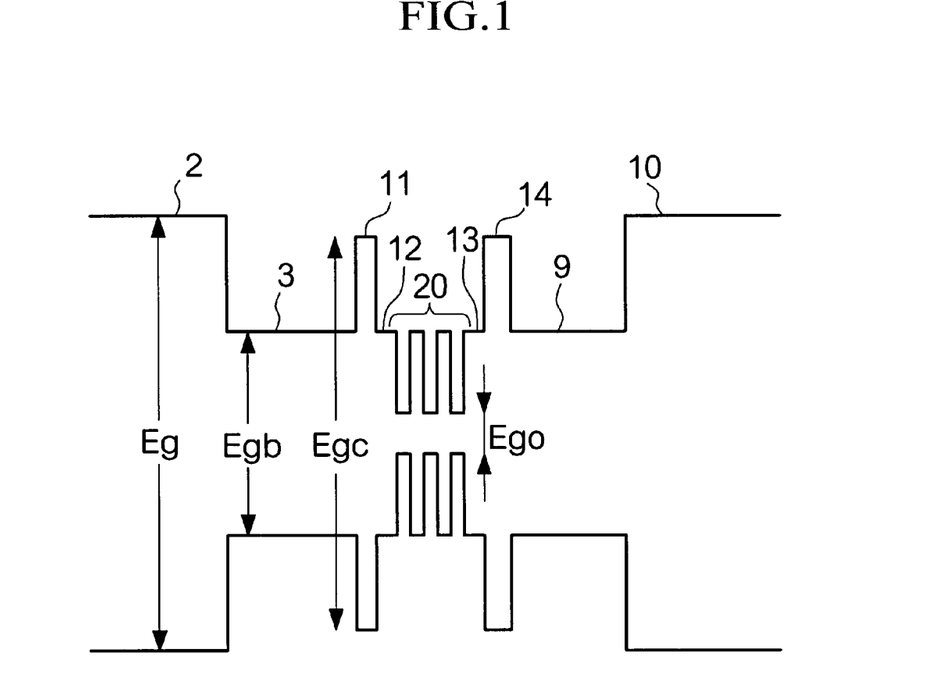
FIG. 1 is a schematic view for explaining band gap in a semiconductor laser according to the present invention
Figure 2:
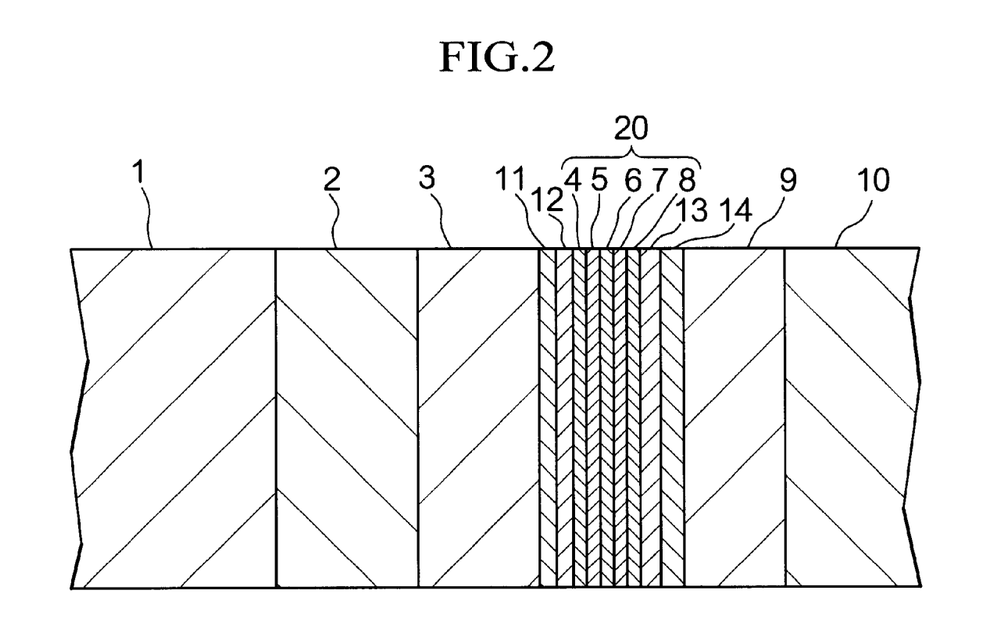
FIG. 2 is a component cross-sectional view of the multiple layer in the same semiconductor laser.

The present inventors completed this invention with the discovery that a 1.6 $\mu$m or higher semiconductor laser which emits at a higher output than e conventional art and has superior temperature stability could be realized for a GaInAs/GaInAsP compressively strained quantum well semiconductor laser having the SCH structure shown in FIG. 4 by forming carrier blocking layers 11,14 formed of a material having a smaller refractive index than that of waveguide layers 3,9 and having a band gap Egc which is larger than band gap Egb of waveguide layers 3,9, in p-type waveguide layer 3 and n-type waveguide layer 9, as shown in FIGS. 1 and 2.

Note that side barrier layers 12,13 are formed in between carrier blocking layers 11,14 and quantum well layers 4,8.

By setting Gallium composition x in [Ga$_x$In$_{1-x}$As] in quantum well layers 4,6,8, which are active layer 20, so that 0<x<0.47 in a quantum well semiconductor laser having the design shown in FIG. 2 and employing GaInAs/GaInAsP, emission at wavelength 1.6 $\mu$m or higher is possible. However, when the inrush current increases in this structure, the electrons and holes injected into active layer 20 (from quantum well layer 4 on the p side to quantum well layer 8 on the n side) are not sufficiently confined in the quantum well region. Thus, electrons and holes overflow to the waveguide layers 3,9, recombination does not occur efficiently in the quantum wells (Ego in the band gap), the characteristic . temperature is at best 60K, and it is difficult to exceed a maximum linear output of 20 mW (at 20° C.).

Accordingly, the present inventors attempted to prevent carrier overflow by forming respective carrier blocking layers 11 and 14 in the vicinity of active layer 20 of p-type waveguide layer 3 and in the vicinity of active layer 20 of n-type waveguide layer 9, as shown in FIGS. 1 and 2.

From this, it was understood that the carrier blocking layers must be of a material having a refractive index which is smaller than that of the waveguide layer, and that carrier overflow cannot be effectively prevented unless the carrier blocking layers are formed to both the p-type and n-type waveguide layers.

A range of 5~20 nm is effective for the thickness of each of the carrier blocking layers 11,14, with a thickness in the range of 5~10 nm being preferable. When the thickness of the carrier blocking layer is less than 5 nm, the electrons and holes readily transmit through carrier blocking layers 11,14 due to the tunneling effect. As a result, it is not possible to effectively control the carrier overflow phenomenon, so that an improvement cannot be realized in the characteristic temperature and maximum linear output. When the thickness of the carrier blocking layers 11,14 exceeds 20 nm, the injection efficiency of the electrons and holes into the active layer becomes extremely poor, leading to an increase in the threshold current or a deterioration in the slope efficiency.

Thus, it is not enough that the carrier blocking layer be sufficiently thick to block the current, but rather a thickness and barrier height (band gap) appropriate so as not to hinder injection are required. In order not to hinder injection, the band gap of the carrier blocking layer has a band gap difference (Egc−Ego) with the waveguide layer (the minimum value for band gap in the case where the waveguide layer is multistepped) of 85~190 meV, in the case of a 1.7 $\mu$m band GaInAs/GaInAsP quantum well laser. As a result, the characteristic temperature is improved.

A carrier which has been injected into the active region will not overflow until is surpasses carrier blocking layers 11,14. In this case, a portion of the electrons can transmit through the blocking layer due to the tunneling effect. The band gap difference (Egc−Ego) between band gap Egc of the carrier blocking layers 11,14 and band gap Ego of quantum well layers 4,6,8 is the crucial index for restraining overflow. In particular, an improvement in the characteristic temperature could be confirmed for a band gap difference (Egc−Ego) in the range of 300 meV~500 meV.

In the present invention's semiconductor laser, carrier blocking layers 11,14 are provided in the p-type waveguide layer 3 and n-type waveguide layer 9 in a GaInAs/GaInAsP compressively strained quantum well semiconductor laser, carrier blocking layers 11,14 having a band gap Ego which is larger than the band gap Egb of the waveguide layer, the difference. between band gap Egc and Egb being in the range of 85~190 meV. Further, the difference (Egc−Ego) between the band gap of carrier blocking layers 11,14 and the band gaps of each of quantum well layers 4,6,8 is in the range of 300 meV~500 meV. Carrier blocking layers 11,14 are formed of a material which has a refractive index which is smaller than that of the waveguide layer. As a result of these features, it is possible to effectively prevent carrier overflow and obtain a semiconductor laser having good temperature stability at high output.

Figure 3:
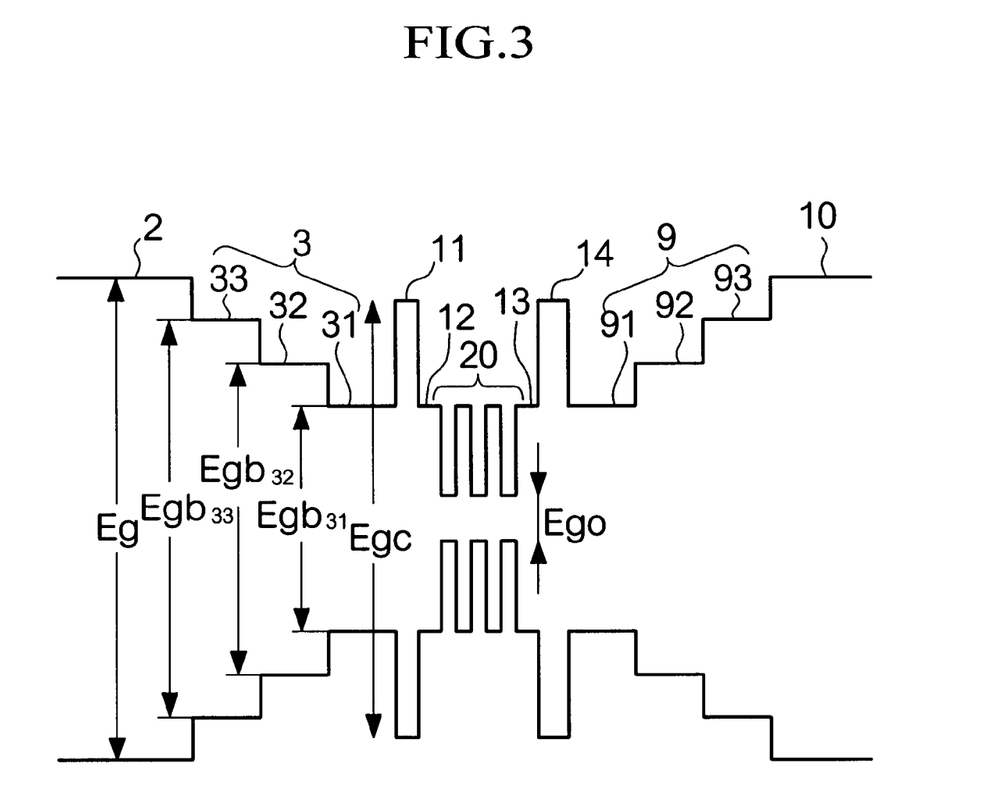
FIG. 3 is a schematic diagram for explaining band gap in a semiconductor laser having a graded index separated confinement multiple layer.

FIG. 3 is a schematic figure for explaining the band gap of a semiconductor laser having a graded index separated confinement heterostructure, hereinafter referred to as GRIN structure. In this design, p-type waveguide layers 31,32,33 and n-type waveguide layers 91,92,93 are provided forming a graded index separated confinement layer. In other words, there is an improvement in the light confinement efficiency of the active layer for a semiconductor laser having a structure in which the band gap Egb of waveguide layers 3 and 9 has a plurality of values. Thus, by making the structure jar-shaped, the carrier injection efficiency into the active layer is improved.

By forming a semiconductor laser in which carrier blocking layers 11,14 having a band gap Egc which has a value larger than the band gap $Egb_{31}$ or $Egb_{91}$ of the lowest level of the waveguide layer, it is possible to effectively prevent carrier overflow with greater certainty. As a result, a semiconductor laser having good temperature stability at high output can be obtained. Note that in general, the refractive index of a semiconductor is inversely proportional to the band gap.

In a semiconductor laser having the structure described above, the characteristic temperature can be improved with greater certainty by satisfying one or more, or all, of the conditions with respect to thickness of carrier blocking layers 11,14; a band gap energy difference in the range of 85 meV~190 meV between band gap energy Egc of carrier blocking layers 11,14 and band gap energy $Egb_{31}$ or $Egb_{91}$ of waveguide layers 3 and 9, i.e., (Egc–$Egb_{31}$) or (Egc–$Egb_{91}$); and a band gap difference (Egc–Ego) in the range of 300 meV~500 meV between carrier blocking layers 11,14 and quantum well layers 4,6,8.

EXAMPLES

Semiconductor lasers for Examples 1~2, and Comparative Examples 1~3 were made, and the properties thereof were evaluated. In the examples, Gallium composition x was 0.32, and a compressive strain of 1% was generated inside the quantum well layers. The lasers were emitted in the range of wavelength 1.71~1.74 μm, and the efficacy of the carrier blocking layer was investigated.

Example 1

A 5 nm thick side barrier layer 13 and a 5 nm thick n-type carrier blocking layer 14 having a compositional wavelength of 1.15 μm were formed in n-type waveguide layer 9 between n-type waveguide layer 9 and quantum well layer 8. A 10 nm thick side barrier layer 12 and a 5 nm thick p-type carrier blocking layer 11 having a compositional wavelength of 1.25 μm were formed in p-type waveguide layer 3 between p-type waveguide layer 3 and quantum well layer 4. In this way, a semiconductor laser having the structure shown in FIGS. 1 and 2 was formed, and the properties thereof were investigated. As shown in Table 1, a maximum linear output of 22 mW was obtained for the semiconductor laser of Example 1. The characteristic temperature was 85K and the slope efficiency was −0.062 dB/K. Thus, an extremely low temperature dependence was obtained.

Example 2

A 10 nm thick n-type carrier blocking layer 14 having a compositional wavelength of 1.15 μm was formed in n-type waveguide layer 9 between n-type waveguide layer 9 and quantum well layer 8. A side barrier layer was not provided. Similarly, a 5 nm thick p-type carrier blocking layer 11 having a compositional wavelength of 1.15 nm was formed in p-type waveguide layer 3. A side barrier layer was not provided.

As shown in Table 1, the semiconductor laser of Example 2 had high properties, with a characteristic temperature of 70K and a maximum linear output of 24 mW. A low temperature dependence with a slope efficiency of −0.073 dB/K was obtained. From a comparison with Example 1, it may understood that a blocking effect is obtained irrespective of the presence or absence of the side barrier layer.

Comparative Example 1 p-type waveguide layer 3 and n-type waveguide layer 9 were both designed so that no carrier blocking layer was provided at all (i.e., structure shown in FIGS. 4 and 5). The temperature dependence of slope efficiency in tis semiconductor laser was −0.081 dB/K, while the characteristic temperature was 51K and the maximum output was 14 mW.

Comparative Example 2

Only a carrier blocking layer 14 was provided to n-type waveguide layer 9, while no carrier blocking layer was provided to p-type waveguide layer 3. This semiconductor laser has the same properties as that of Comparative Example 1, with a characteristic temperature of 50K and a maximum linear output of 12 mW. While hole overflow could be prevented in this design, electron overflow toward the n side could not be prevented. As a result, it was not possible to achieve an improvement in the properties of the semiconductor laser.

Comparative Example 3

A 10 nm thick side barrier layer 13 and a 5 nm thick n-type carrier blocking layer 14 having a compositional wavelength of 1.15 μm were formed in n-type waveguide layer 9 between n-type waveguide layer 9 and quantum well layer 8. In addition, a 10 nm thick side barrier layer 12 and a 3 nm thick p-type carrier blocking layer 11 having a compositional wavelength of 1.15 nm were formed in p-type waveguide layer 3 between p-type waveguide layer 3 and quantum well layer 4. The properties of this semiconductor laser were not much improved as compared to Comparative Example 1, with a characteristic temperature of 60K, a slope efficiency temperature dependence of ~0.067dB/K and a maximum linear output of 14 mW. In this design, the thickness of the carrier blocking layer 11 on the p side was thin, at 3 nm. The electrons and holes readily passed through the carrier blocking layer due to the tunneling effect, so that a sufficient carrier overflow blocking effect could not be obtained.

These results are summarized in Table 1.

TABLE 1

|  | Example 1 | Example 2 | Comp. Ex. 1 | Comp. Ex. 2 | Comp. Ex. 3 |
|---|---|---|---|---|---|
| n-type carrier blocking layer | Present | Present | absent | present | Present |
| Thickness (nm) | 5 | 10 | — | 10 | 5 |
| Compositional wavelength (μm) | 1.15 | 1.15 | — | 0.92 | 1.15 |
| side barrier layer | Present | Absent | absent | present | Present |

TABLE 1-continued

|  | Example 1 | Example 2 | Comp. Ex. 1 | Comp. Ex. 2 | Comp. Ex. 3 |
|---|---|---|---|---|---|
| Thickness (nm) | 5 | — | — | 10 | 10 |
| Compositional wavelength ($\mu$m) | 1.26 | — | — | 1.25 | 1.26 |
| Quantum well layer | Present | Present | present | present | Present |
| Number of layers | 3 | 3 | 3 | 3 | 3 |
| Thickness of well layer (nm) | 8 | 8 | 8 | 8 | 8 |
| Strain quantity (%) | 1.0 | 1.0 | 1.0 | 1.0 | 1.0 |
| Thickness of barrier layer (nm) | 10 | 10 | 10 | 10 | 10 |
| Compositional wavelength ($\mu$m) | 1.25 | 1.25 | 1.25 | 1.25 | 1.25 |
| p-type carrier blocking layer | Present | Present | absent | absent | Present |
| Thickness (nm) | 5 | 5 | — | — | 3 |
| Compositional wavelength ($\mu$m) | 1.15 | 1.15 | — | — | 1.15 |
| Slope efficiency temperature dependence (dB/K) | −0.062 | −0.073 | −0.081 | −0.082 | −0.074 |
| Characteristic temperature (K) | 85 | 70 | 51 | 50 | 60 |
| Maximum linear output (mW) (operational temperature 20° C.) | 22 | 24 | 14 | 12 | 16 |

Next, for Examples 3 through 6, semiconductor lasers which had emission wavelengths of 1.71~1.74 $\mu$m were formed in which the Gallium composition was 0.32 in quantum well layers 4,6,8 of active layer 20. The composition and thickness of the carrier blocking layers (p-type carrier blocking layer 11 and n-type carrier blocking layer 14) were varied. All other layers had the same composition and compositional ratio. For comparative purposes, in Comparative Examples 4 through 11, semiconductor lasers which also emitted at a wavelength of 1.71~1.74 $\mu$m were formed in which the compositional ratio and thickness were varied The temperature characteristics of these semiconductor lasers were measured, and the properties thereof were evaluated. In addition, note that in Comparative Example 12, a semiconductor laser in which carrier blocking layers 11,14 were not formed was prepared in order to compare temperature characteristics.

In Example 7, a semiconductor laser was formed in which the waveguide layer was a graded index separated confinement layer (GRIN structure), and a carrier blocking layer was formed thereto. The temperature characteristics of this semiconductor laser were evaluated in the same manner.

Note that quantum well layers 4,6,8 and waveguide layers 3,9 were all provided with the same structure, and the characteristic temperature was measured within the range of 20° C. to 40° C. while varying the conditions for carrier blocking layers 11,14 and side barrier layers 12,13.

The value of band gap Ego of quantum well layers 4,6,8 is an estimated value determined by calculation of Luttinger-Korn Hamiltonian. The values of band gap Egb of waveguide layers 3,9 and band gap Egc of carrier blocking layers 11,14 are determined by converting the compositional wavelength into energy.

These semiconductor lasers were formed in accordance with the following process.

An InP layer was formed as p-type cladding layer 2 onto p-type InP substrate 1. p-type waveguide layer 3 was formed on top of p-type cladding layer 2. Active layer 20 was formed by forming a 3-layer structure of quantum well layers 4,6,8, which are separated from one another by barrier layers 5,7, in between side barrier layers 12,13. Side barrier layers 12,13 are provided to the inside walls of carrier blocking layers 11,14, in the area sandwiched between p-type carrier blocking layer 11 and n-type carrier blocking layer 14. An n-type waveguide layer 9 was also formed, followed finally by n-type InP cladding layer 10.

Example 3

The material composition, thickness, and compositional wavelength of each of the layers in the semiconductor laser in this example are as follows.

p-type cladding layer 2
 composition: InP
 thickness: 2 $\mu$m
p-type waveguide layer 3
 composition: $In_{0.74}Ga_{0.26}As_{0.55}P_{0.45}$
 thickness: 0.2 $\mu$m
 compositional wavelength: 1.25 $\mu$m
p-type carrier blocking layer 11
 composition: $In_{0.81}Ga_{0.19}As_{0.41}P_{0.59}$
 thickness: 5 nm
 compositional wavelength: 1.15 $\mu$m
side barrier layer 12
 composition: $In_{0.74}Ga_{0.26}As_{0.55}P_{0.45}$
 thickness: 5 nm
 compositional wavelength: 1.25 $\mu$m
quantum well layers 4, 6, 8
 composition: $In_{0.68}Ga_{0.32}As$
 thickness: 5 nm
 number of layers: 3
side barrier layer 13
 composition: $In_{0.74}Ga_{0.26}As_{0.55}P_{0.45}$
 thickness: 5 nm
 compositional wavelength: 1.25 $\mu$m
n-type carrier blocking layer 14
 composition: $In_{0.81}Ga_{0.19}As_{0.41}P_{0.59}$
 thickness: 5 nm
 compositional wavelength: 1.15 $\mu$m
n-type waveguide layer 9
 composition: $In_{0.74}Ga_{0.26}As_{0.55}P_{0.45}$
 thickness: 0.2 $\mu$m
 compositional wavelength: 1.25 $\mu$m
n-type cladding layer 10
 composition: InP
 thickness: 2 $\mu$m At a thickness of 5 nm for carrier blocking layers 11,14, and a compositional wavelength of 1.15 $\mu$m:
 Egc–Ego (band gap difference between carrier blocking layer and difference between first ground state level in the quantum well layer)=457 meV.
 Egc–Egb (band gap difference between waveguide layer and carrier blocking layer)=189 meV.
 Characteristic temperature of semiconductor laser at this time: 85K.

Example 4

In this example, a semiconductor laser was formed in which the composition and thickness of p-type carrier blocking layer 11 and n-type carrier blocking layer 14 were as follows. All other layers in this semiconductor laser had the same thickness and composition as in Example 3.

p-type carrier blocking layer 11
  composition: $In_{0.88}Ga_{0.12}As_{0.25}P_{0.75}$
  thickness: 5 nm
  compositional wavelength: 1.05 μm
n-type carrier blocking layer 14
  composition: $In_{0.88}Ga_{0.12}As_{0.25}P_{0.75}$
  thickness: 5 nm
  compositional wavelength: 1.05 μm At a thickness of 5 nm for carrier blocking layers 11,14, and compositional wavelength of 1.05 μm:
  Egc–Ego=354 meV.
  Egc–Egb=86 meV.
  Characteristic temperature of semiconductor laser at this time: 70K.

Example 5

In this examples a semiconductor laser was formed in which the thickness of p-type carrier blocking layer 11 and n-type carrier blocking layer 14 were 10 nm as follows. All other layers in this semiconductor laser had the same thickness and composition as in Example 3.

p-type carrier blocking layer 11
  composition: $In_{0.81}Ga_{0.19}As_{0.41}P_{0.59}$
  thickness: 10 nm
  compositional wavelength: 1.15 μm
n-type carrier blocking layer 14
  composition: $In_{0.81}Ga_{0.19}As_{0.41}P_{0.59}$
  thickness: 10 nm
  compositional wavelength: 1.15 μm
Egc–Ego=457 meV.
Egc–Egb=189 meV.
Characteristic temperature of semiconductor laser at this time: 75K.

Example 6

In this example, a semiconductor laser was formed in which the thickness of p-type carrier blocking layer 11 and n-type carrier blocking layer 14 were 10 nm as follows. All other layers in this semiconductor laser had a thickness and composition equivalent to that in Example 4.

p-type carrier blocking layer 11
  composition: $In_{0.88}Ga_{0.12}As_{0.25}P_{0.75}$
  thickness: 10 nm
  compositional wavelength: 1.05 μm
n-type carrier blocking layer 14
  composition: $In_{0.88}Ga_{0.12}As_{0.25}P_{0.75}$
  thickness: 10 nm
  compositional wavelength: 1.05 μm
Egc–Ego=354 meV.
Egc–Egb=86 meV.
Characteristic temperature of semiconductor laser at this time: 70K.

Example 7

As shown in FIG. 3, the waveguide layer is rendered as a structure in which the refractive index changes are graded stepwise from 31,32,33 and 91,92,93 (3 step GRIN structure), with carrier blocking layers 11,14 disposed thereto. All other features of the semiconductor laser formed were equivalent to Example 6.

p-type cladding layer 2
  composition: InP
  thickness: 2 μm
p-type waveguide layer 31,32,33 (3 step GRIN structure)
  first step (31): $In_{0.73}Ga_{0.27}As_{0.57}P_{0.43}$
    thickness: 66 nm
  second step (32): $In_{0.81}Ga_{0.19}As_{0.41}P_{0.59}$
    thickness: 66 nm
  third step (33): $In_{0.87}Ga_{0.13}As_{0.27}P_{0.73}$
    thickness: 66 nm

| compositional wavelength: | first step 1.25 μm |
|---|---|
| | second step 1.15 μm |
| | third step 1.05 μm | p-type carrier blocking layer 11
  composition: $In_{0.88}Ga_{0.12}As_{0.25}P_{0.75}$
  thickness: 10 nm
  compositional wavelength: 1.05 μm
side barrier layers 12,13
  composition: $In_{0.74}Ga_{0.26}As_{0.55}P_{0.45}$
  thickness: 5 nm
  compositional wavelength: 1.25 μm
quantum well layers 4,6,8
  composition: $In_{0.68}Ga_{0.32}As$
  thickness: 5 nm
  number of layers: 3
n-type carrier blocking layer 14
  composition: $In_{0.88}Ga_{0.12}As_{0.25}P_{0.75}$
  thickness: 10 nm
  compositional wavelength: 1.05 μm
n-type waveguide layer 91,92,93 (3 step GRIN structure)
  first step (91): $In_{0.73}Ga_{0.27}As_{0.57}P_{0.43}$
    thickness: 66 nm
  second step (92): $In_{0.81}Ga_{0.19}As_{0.41}P_{0.59}$
    thickness: 66 nm
  third step (93): $In_{0.87}Ga_{0.13}As_{0.27}P_{0.73}$
    thickness: 66 nm

| compositional wavelength: | first step 1.25 μm |
|---|---|
| | second step 1.15 μm |
| | third step 1.05 μm | n-type cladding layer 10
  composition: InP
  thickness: 2 μm
Egc–Ego=354 meV.
Egc–Egb=86 meV.
Characteristic temperature of semiconductor laser at this time: 75K.

Comparative Example 4

The material composition of each of the layers in the semiconductor laser formed in this comparative example was equivalent to Example 3. Carrier blocking layers 11,14 were provided with different thicknesses of 3 nm and 10 nm. With this exception, all other thicknesses were the same as in Example 3.

p-type carrier blocking layer 11
  composition: $In_{0.81}Ga_{0.19}As_{0.41}P_{0.59}$
  thickness: 10 nm
  compositional wavelength: 1.15 μm n-type carrier blocking layer 14
  composition: $In_{0.81}Ga_{0.19}As_{0.41}P_{0.59}$
  thickness: 3 nm
  compositional wavelength: 1.15 μm
Egc−Ego=457 meV.
Egc−Egb=189 meV.
Characteristic temperature of semiconductor laser at this time: 50K (The n-type carrier blocking layer was thin.).

Comparative Example 5

In this comparative example, a semiconductor laser in which the composition and thickness of p-type carrier blocking layer 11 and n-type carrier blocking layer 14 were as follows. All other layers in this semiconductor laser had the same composition and thickness as in Example 3.
  p-type carrier blocking layer 11
    composition: InP
    thickness: 3 nm
    compositional wavelength: 0.92 μm
  n-type carrier blocking layer 14
    composition: InP
    thickness: 3 nm
    compositional wavelength: 0.92 μm
Egc−Ego=624 meV.
Egc−Egb=356 meV.
Characteristic temperature of semiconductor laser at this time: 60K.

The height (Egc−Egb=356 meV) of the barrier layer was increased as compared to Comparative Example 4, however, there was not much improvement in characteristic temperature. Carrier blocking layers 11,14 were thin, at 3 nm. Most of the injected electrons transmitted through due to the tunneling effect, confirming that there was no function as a wall layer.

Comparative Example 6

In this comparative example, a semiconductor laser was formed in which the thickness of carrier blocking layers 11,14 in Comparative Example 5 was increased to 5 nm. The composition and thicknesses of the other layers were the same as in Comparative Example 5.
Egc−Ego=624 meV.
Egc−Egb=356 meV.
Characteristic temperature of semiconductor laser at this time: 60K.

The characteristic temperature was the same as in Comparative Example 5. This compositional structure provided no particular improvement even when the thickness of the carrier blocking layer was increased.

Comparative Example 7

In this comparative example, the thickness of carrier blocking layers 11,14 in Comparative Example 5 was increased further, to 10 nm. The compositional structure for the other layers was the same as in Comparative Example 5.
Egc−Ego=624 meV.
Egc−Egb=356 meV.
Characteristic temperature of semiconductor laser at this time: 48K.

An improvement in characteristic temperature could not be confirmed, with the characteristic temperature lower than in Comparative Examples 5 and 6.

Comparative Example 8

In this comparative example, the thickness of carrier blocking layers 11,14 in Comparative Example 5 was increased further, to 15 nm. The compositional structure for the other layers was the same as in Comparative Example 5.
  p-type carrier blocking layer 11
    composition: $In_{0.81}Ga_{0.19}As_{0.41}P_{0.59}$
    thickness: 15 nm
    compositional wavelength: 1.15 μm
  n-type carrier blocking layer 14
    composition: $In_{0.81}Ga_{0.19}As_{0.41}P_{0.59}$
    thickness: 15 nm
    compositional wavelength: 1.15 μm
Egc−Ego=457 meV.
Egc−Egb=189 meV.
Characteristic temperature of semiconductor laser at his time: 54K.

No particular improvement in characteristic temperature over Example 5 could be confirmed.

Comparative Example 9

In this comparative example, a semiconductor laser was formed in which the thickness of carrier blocking layers 11,14 in Example 4 was increased to 15 nm. The composition and thicknesses of the other layers were the same as in Example 4.
  p-type carrier blocking layer 11
    composition: $In_{0.88}Ga_{0.12}As_{0.25}P_{0.75}$
    thickness: 15 nm
    compositional wavelength: 1.05 μm
  n-type carrier blocking layer 14
    composition: $In_{0.88}Ga_{0.12}As_{0.25}P_{0.75}$
    thickness: 15 nm
    compositional wavelength: 1.05 μm
Egc−Ego=354 meV.
Egc−Egb=86 meV.
Characteristic temperature of semiconductor laser at this time: 45K.

Comparative Example 10

In this comparative example, a semiconductor laser was formed in which the thickness of carrier blocking layers 11,14 in Comparative Example 5 was 15 nm. The compositional structure and thicknesses of the other layers were the same as in Comparative Example 5.
  carrier blocking layer 11,14
    composition: InP
    thickness: 15 nm
    compositional wavelength: 0.92 μm
Egc−Ego=624 meV.
Egc−Egb=356 meV.
No emission was obtained.

Comparative Example 11

In this comparative example, a semiconductor laser was formed in which the thickness of carrier blocking layers 11,14 in Comparative Example 5 was increased further to 19 nm. The compositional structures and thicknesses of the other layers were the same as in Comparative Example 5.
  carrier blocking layer 11,14
    composition: InP
    thickness: 19 nm
    compositional wavelength: 0.92 μm
Egc−Ego=624 meV.
Egc−Egb=356 meV.
No emission was obtained.

Comparative Example 12

In this example, a conventional semiconductor laser was formed in which the carrier blocking layer shown in FIG. 4 was not provided. The steps for this production were as follows. A cladding layer of p-type InP layer 2 was formed on top of p-type InP substrate 1. A p-type waveguide layer 3 was formed on top of this. Active layer 20 was formed by forming the 3-layer structure of quantum wells 4,6,9 separated respectively by barriers 5,7. An n-type waveguide layer 9 was then formed, followed finally by an n-type InP cladding layer 10. The specific structural arrangement was as follows.

p-type cladding layer 2
    composition: InP
    thickness: 2 μm p-type waveguide layer 3
    composition: $In_{0.74}Ga_{0.26}As_{0.55}P_{0.45}$
    thickness: 0.2 μm
    compositional wavelength: 1.25 μm quantum well layers 4,6,8
    composition: $In_{0.68}Ga_{0.32}As$
    thickness: 5 nm
    number of layers: 3 n-type waveguide layer 9
    composition: $In_{0.74}Ga_{0.26}As_{0.55}P_{0.45}$
    thickness: 0.2 μm
    compositional wavelength: 1.25 μm n-type cladding layer 10
    composition: InP
    thickness: 2 μm Characteristic temperature of semiconductor laser: 51K.

Tables 2 through 4 show characteristic temperatures as well as the structural arrangements of the various layers for the semiconductor lasers having emission wavelengths of 1.71~1.74 μm that were formed in Examples 3~7 and Comparative Examples 4~12 having varying compositional structures and thicknesses.

Characteristic temperature was determined by the following formula.

$$T_0 = \Delta T / Ln(I_{th}/I_0)$$

Where:
    $T_0$: characteristic temperature (K).
    $\Delta T$: temperature difference (K) at two points where the threshold current value is measured.
    $I_{th}$: threshold current value (A) at higher temperature.
    $I_0$: threshold current value (A) at lower temperature.

TABLE 2

| New items | Example 3 | Example 4 | Example 5 | Example 6 | Example 7 |
|---|---|---|---|---|---|
| n-InP cladding layer 10 thickness (μm) | 2 | 2 | 2 | 2 | 2 |
| n-type waveguide layer 9 | $In_{0.74}Ga_{0.26}As_{0.55}P_{0.45}$ | $In_{0.74}Ga_{0.26}As_{0.55}P_{0.45}$ | $In_{0.74}Ga_{0.26}As_{0.55}P_{0.45}$ | $In_{0.74}Ga_{0.26}As_{0.55}P_{0.45}$ | 3 step GRIN |
| thickness (μm) | 0.2 | 0.2 | 0.2 | 0.2 | 0.2 |
| compositional wavelength (μm) | 1.25 | 1.25 | 1.25 | 1.25 | 1.25 – 1.05 |
| n-type carrier blocking layer 14 | $In_{0.81}Ga_{0.19}As_{0.41}P_{0.59}$ | $In_{0.88}Ga_{0.12}As_{0.25}P_{0.75}$ | $In_{0.81}Ga_{0.19}As_{0.41}P_{0.59}$ | $In_{0.88}Ga_{0.12}As_{0.25}P_{0.75}$ | $In_{0.88}Ga_{0.12}As_{0.25}P_{0.75}$ |
| thickness (nm) | 5 | 5 | 10 | 10 | 10 |
| compositional wavelength (μm) | 1.15 | 1.05 | 1.15 | 1.05 | 1.05 |
| band gap difference (Egc – Ego)meV | 457 | 354 | 457 | 354 | 354 |
| band gap difference (Egc – Egb)meV | 189 | 86 | 189 | 86 | 86 |
| side barrier layer 13 | $In_{0.74}Ga_{0.26}As_{0.55}P_{0.45}$ | $In_{0.74}Ga_{0.26}As_{0.55}P_{0.45}$ | $In_{0.74}Ga_{0.26}As_{0.55}P_{0.45}$ | $In_{0.74}Ga_{0.26}As_{0.55}P_{0.45}$ | $In_{0.74}Ga_{0.26}As_{0.55}P_{0.45}$ |
| thickness (nm) | 5 | 5 | 5 | 5 | 5 |
| compositional wavelength (μm) | 1.25 | 1.25 | 1.25 | 1.25 | 1.25 |
| Quantum well layers 4, 6, 8 | $In_{0.68}Ga_{0.32}As$ | $In_{0.68}Ga_{0.32}As$ | $In_{0.68}Ga_{0.32}As$ | $In_{0.68}Ga_{0.32}As$ | $In_{0.68}Ga_{0.32}As$ |
| Number of layers | 3 | 3 | 3 | 3 | 3 |
| Quantum well thickness (nm) | 5 | 5 | 5 | 5 | 5 |
| Compositional wavelength (μm) | | | | | |
| side barrier layer 12 | $In_{0.74}Ga_{0.26}As_{0.55}P_{0.45}$ | $In_{0.74}Ga_{0.26}As_{0.55}P_{0.45}$ | $In_{0.74}Ga_{0.26}As_{0.55}P_{0.45}$ | $In_{0.74}Ga_{0.26}As_{0.55}P_{0.45}$ | $In_{0.74}Ga_{0.26}As_{0.55}P_{0.45}$ |
| thickness (nm) | 5 | 5 | 5 | 5 | 5 |
| compositional wavelength (μm) | 1.25 | 1.25 | 1.25 | 1.25 | 1.25 |
| p-type carrier blocking layer 11 | $In_{0.81}Ga_{0.19}As_{0.41}P_{0.59}$ | $In_{0.88}Ga_{0.12}As_{0.25}P_{0.75}$ | $In_{0.81}Ga_{0.19}As_{0.41}P_{0.59}$ | $In_{0.88}Ga_{0.12}As_{0.25}P_{0.75}$ | $In_{0.88}Ga_{0.12}As_{0.25}P_{0.75}$ |
| thickness (nm) | 5 | 5 | 10 | 10 | 10 |
| compositional wavelength (μm) | 1.15 | 1.05 | 1.15 | 1.05 | 1.05 |
| band gap difference (Egc – Ego(meV) | 457 | 354 | 457 | 354 | 354 |
| band gap difference (Egc – Egb)meV | 189 | 86 | 189 | 86 | 86 |
| p-type waveguide layer 3 | $In_{0.74}Ga_{0.26}As_{0.55}P_{0.45}$ | $In_{0.74}Ga_{0.26}As_{0.55}P_{0.45}$ | $In_{0.74}Ga_{0.26}As_{0.55}P_{0.45}$ | $In_{0.74}Ga_{0.26}As_{0.55}P_{0.45}$ | 3 step GRIN |
| thickness (μm) | 0.2 | 0.2 | 0.2 | 0.2 | 0.2 |
| compositional wavelength (μm) | 1.25 | 1.25 | 1.25 | 1.25 | 1.25 – 1.05 |
| p-InP cladding layer 2 thickness (μm) | 2 | 2 | 2 | 2 | 2 |
| Characteristic temperature (K) | 85 | 70 | 75 | 70 | 75 |

TABLE 3

| New items | Comp. Example 4 | Comp. Example 5 | Comp. Example 6 | Comp. Example 7 | Comp. Example 8 |
|---|---|---|---|---|---|
| n-InP cladding layer 10 thickness ($\mu$m) | 2 | 2 | 2 | 2 | 2 |
| n-type wavelength layer 9 | $In_{0.74}Ga_{0.26}As_{0.55}P_{0.45}$ | $In_{0.74}Ga_{0.26}As_{0.55}P_{0.45}$ | $In_{0.74}Ga_{0.26}As_{0.55}P_{0.45}$ | $In_{0.74}Ga_{0.26}As_{0.55}P_{0.45}$ | $In_{0.74}Ga_{0.26}As_{0.55}P_{0.45}$ |
| thickness ($\mu$m) | 0.2 | 0.2 | 0.2 | 0.2 | 0.2 |
| compositional wavelength ($\mu$m) | 1.25 | 1.25 | 1.25 | 1.25 | 1.25 |
| n-type carrier blocking layer 14 | $In_{0.81}Ga_{0.19}As_{0.41}P_{0.59}$ | InP | InP | InP | $In_{0.81}Ga_{0.19}As_{0.41}P_{0.59}$ |
| thickness (nm) | 3 | 3 | 5 | 10 | 15 |
| compositional wavelength ($\mu$m) | 1.15 | 0.92 | 0.92 | 0.92 | 1.15 |
| band gap difference (Egc − Ego) | 457 | 624 | 624 | 624 | 457 |
| band gap difference (Egc − Egb) | 189 | 356 | 356 | 356 | 189 |
| side barrier layer 13 | $In_{0.74}Ga_{0.26}As_{0.55}P_{0.45}$ | $In_{0.74}Ga_{0.26}As_{0.55}P_{0.45}$ | $In_{0.74}Ga_{0.26}As_{0.55}P_{0.45}$ | $In_{0.74}Ga_{0.26}As_{0.55}P_{0.45}$ | $In_{0.74}Ga_{0.26}As_{0.55}P_{0.45}$ |
| thickness (nm) | 5 | 5 | 5 | 5 | 5 |
| compositional wavelength ($\mu$m) | 1.25 | 1.25 | 1.25 | 1.25 | 1.25 |
| quantum well layers 4, 6, 8 | $In_{0.68}Ga_{0.32}As$ | $In_{0.68}Ga_{0.32}As$ | $In_{0.68}Ga_{0.32}As$ | $In_{0.68}Ga_{0.32}As$ | $In_{0.68}Ga_{0.32}As$ |
| number of layers | 3 | 3 | 3 | 3 | 3 |
| wall thickness (nm) | 5 | 5 | 5 | 5 | 5 |
| compositional wavelength ($\mu$m) | | | | | |
| side barrier layer 12 | $In_{0.74}Ga_{0.26}As_{0.55}P_{0.45}$ | $In_{0.74}Ga_{0.26}As_{0.55}P_{0.45}$ | $In_{0.74}Ga_{0.26}As_{0.55}P_{0.45}$ | $In_{0.74}Ga_{0.26}As_{0.55}P_{0.45}$ | $In_{0.74}Ga_{0.26}As_{0.55}P_{0.45}$ |
| thickness (nm) | 10 | 10 | 5 | 5 | 5 |
| compositional wavelength ($\mu$m) | 1.25 | 1.25 | 1.25 | 1.25 | 1.25 |
| p-type carrier blocking layer 11 | $In_{0.81}Ga_{0.19}As_{0.41}P_{0.59}$ | InP | InP | InP | $In_{0.81}Ga_{0.19}As_{0.41}P_{0.59}$ |
| thickness (nm) | 10 | 3 | 5 | 10 | 15 |
| compositional wavelength ($\mu$m) | 1.15 | 0.92 | 0.92 | 0.92 | 1.15 |
| band gap difference (Egc − Ego)meV | 457 | 624 | 624 | 624 | 457 |
| band gap difference (Egc − Egb)meV | 189 | 356 | 356 | 356 | 189 |
| p-type waveguide layer 3 | $In_{0.74}Ga_{0.26}As_{0.55}P_{0.45}$ | $In_{0.74}Ga_{0.26}As_{0.55}P_{0.45}$ | $In_{0.74}Ga_{0.26}As_{0.55}P_{0.45}$ | $In_{0.74}Ga_{0.26}As_{0.55}P_{0.45}$ | |
| thickness ($\mu$m) | 0.2 | 0.2 | 0.2 | 0.2 | 0.2 |
| compositional wavelength ($\mu$m) | 1.25 | 1.25 | 1.25 | 1.25 | 1.25 |
| p-InP cladding layer 2 thickness ($\mu$m) | 2 | 2 | 2 | 2 | 2 |
| Characteristic temperature (K) | 50 | 60 | 60 | 48 | 54 |

TABLE 4

| New items | Comp. Example 9 | Comp. Example 10 | Comp. Example 11 | Comp. Example 12 |
|---|---|---|---|---|
| n-InP cladding layer 10 thickness ($\mu$m) | 2 | 2 | 2 | 2 |
| n-type waveguide layer 9 | $In_{0.74}Ga_{0.26}As_{0.55}P_{0.45}$ | $In_{0.74}Ga_{0.26}As_{0.55}P_{0.45}$ | $In_{0.74}Ga_{0.26}As_{0.55}P_{0.45}$ | $In_{0.74}Ga_{0.26}As_{0.55}P_{0.45}$ |
| thickness ($\mu$m) | 0.2 | 0.2 | 0.2 | 0.2 |
| compositional wavelength ($\mu$m) | 1.25 | 1.25 | 1.25 | 1.25 |
| n-type carrier blocking layer 14 | $In_{0.88}Ga_{0.12}As_{0.25}P_{0.75}$ | InP | InP | none |
| thickness (nm) | 15 | 15 | 19 | |
| compositional wavelength ($\mu$m) | 1.05 | 0.92 | 0.92 | |
| Band gap difference (Egc − Ego)meV | 354 | 624 | 624 | |
| Band gap difference (Egc − Egb)meV | 86 | 356 | 356 | |
| Side barrier layer 13 | $In_{0.74}Ga_{0.26}As_{0.55}P_{0.45}$ | $In_{0.74}Ga_{0.26}As_{0.55}P_{0.45}$ | $In_{0.74}Ga_{0.26}As_{0.55}P_{0.45}$ | none |
| Thickness (nm) | 5 | 5 | 5 | |
| Compositional wavelength ($\mu$m) | 1.25 | 1.25 | 1.25 | |
| Quantum well layers 4, 6, 8 | $In_{0.68}Ga_{0.32}As$ | $In_{0.68}Ga_{0.32}As$ | $In_{0.68}Ga_{0.32}As$ | $In_{0.68}Ga_{0.32}As$ |
| Number of layers | 3 | 3 | 3 | 3 |
| Well thickness (nm) | 5 | 5 | 5 | 5 |
| compositional wavelength ($\mu$m) | | | | |
| Side barrier layer 12 | $In_{0.74}Ga_{0.26}As_{0.55}P_{0.45}$ | $In_{0.74}Ga_{0.26}As_{0.55}P_{0.45}$ | $In_{0.74}Ga_{0.26}As_{0.55}P_{0.45}$ | none |
| Thickness (nm) | 5 | 5 | 5 | |
| Compositional wavelength ($\mu$m) | 1.25 | 1.25 | 1.25 | |
| p-type carrier blocking layer 11 | $In_{0.88}Ga_{0.12}As_{0.25}P_{0.75}$ | InP | InP | none |
| thickness ($\mu$m) | 15 | 15 | 19 | |
| compositional wavelength ($\mu$m) | 1.05 | 0.92 | 0.92 | |
| Band gap difference (Egc − Ego)meV | 354 | 624 | 624 | |
| Band gap difference (Egc − Egb)meV | 86 | 356 | 356 | |

TABLE 4-continued

| New items | Comp. Example 9 | Comp. Example 10 | Comp. Example 11 | Comp. Example 12 |
|---|---|---|---|---|
| p-type waveguide layer 3 | $In_{0.74}Ga_{0.26}As_{0.55}P_{0.45}$ | $In_{0.74}Ga_{0.26}As_{0.55}P_{0.45}$ | $In_{0.74}Ga_{0.26}As_{0.55}P_{0.45}$ | $In_{0.74}Ga_{0.26}As_{0.55}P_{0.45}$ |
| thickness ($\mu$m) | 0.2 | 0.2 | 0.2 | 0.2 |
| compositional wavelength ($\mu$m) | 1.25 | 1.25 | 1.25 | 1.25 |
| p-InP cladding layer 2 thickness ($\mu$m) | 2 | 2 | 2 | 2 |
| Characteristic temperature (K) | 45 | no emission | no emission | 51 |

As is clear from Tables 2 through 4, the characteristic temperature of a semiconductor laser in which carrier blocking layers are provided demonstrates higher temperature characteristics as compared to the semiconductor laser in Comparative Example 12 which did not have a carrier blocking layer. However, the characteristic temperature varies depending on the thickness of the carrier blocking layer. Namely, a characteristic temperature in the range of 50~85K is obtained when the carrier blocking layer has a thickness in the range of 3~10 nm while the characteristic temperature falls to a low value of 50K or less at thicknesses of 10 nm or more. Moreover, it was confirmed that excitation and emission may not occur in the semiconductor laser when the thickness of the carrier blocking layer is 15 nm or more.

In the above equation, $\Delta T/T_0$ approaches zero as the characteristic temperature becomes higher. Accordingly, ($I_{th}/I_0$) approaches 1, and the difference between the threshold current $I_{th}$ and $I_0$ due to temperature variation becomes smaller. This means that stable operation of the semiconductor laser at high temperature can be obtained.

In other words, by providing a carrier blocking layer, the characteristic temperature can be increased and the temperature dependence of semiconductor laser emission can be decreased. As a result, emission of stable laser light is possible. In order to reduce temperature dependence in a stable manner, it is necessary to appropriately select the thickness of the carrier blocking layer. Specifically, it was confirmed that a thickness in the range of 3~15 nm, and preferably 5~10 nm, was appropriate.

In particular, high temperature characteristics of 85K were obtained for a semiconductor laser employing Example 3's carrier blocking layers 11,14 having a thickness of 5 nm and a compositional structure of $In_{0.81}Ga_{0.19}As_{0.41}P_{0.59}$.

In addition, it was also confirmed that a semiconductor laser having extremely good temperature characteristics was possible in Example 7's semiconductor laser having a GRIN structure.

Thus, in the present invention's semiconductor laser, carrier blocking layers 11,14 are provided in the p-type waveguide layer 3 and n-type waveguide layer 9 in a GaInAs/GaInAsP compressively strained quantum well semiconductor laser, carrier blocking layers 11,14 having a band gap Egc which is larger than the band gap Egb of the waveguide layer, the difference between band gap Egc and Egb being in the range of 85~190 meV. Further, the difference (Egc−Ego) between the band gap of carrier blocking layers 11,14 and each band gap of quantum well layers 4,6,8 is in the range of 300 meV~500 meV. Carrier blocking layers 11,14 are formed of a material which has a refractive index which is smaller than that of the waveguide layer. As a result of these features, it is possible to effectively prevent carrier overflow and obtain a semiconductor laser having good temperature stability at high output.

In the present invention, carrier blocking layers are provided in a p-type waveguide layer and an n-type waveguide layer in a GaInAs/GaInAsP compressively strained quantum well semiconductor laser, these carrier blocking layers having a band gap Egc which is larger than the band gap Egb of the waveguide layer, and being formed of a material which has a refractive index which is smaller than that of the waveguide. As a result, it is possible to effectively prevent carrier overflow and obtain a semiconductor laser having good temperature stability at high output.

In addition, the present invention offers an optical semiconductor laser that emits at high power, for which the threshold current and efficiency have a low temperature dependence, this invention expanding laser applications in medical instruments, manufacturing and spectroscopy as well as in optical sources for fiber communications.

What is claimed:

1. A semiconductor laser, comprising:
   a compressively strained quantum well semiconductor laser including GaInAs/GaInAsP and including p-type and n-type waveguide layers, each of said p-type and n-type waveguide layers including plural waveguide layers each with a different band gap;
   a first p-type carrier blocking layer provided in said p-type waveguide layer, wherein a value of a band gap of said first carrier blocking layer is larger than a smallest value of said different band gaps of said plural waveguide layers of said p-type waveguide layer; and
   a second n-type carrier blocking layer provided in said n-type waveguide layer, wherein a value of a band gap of said second carrier blocking layer is larger than a smallest value of said different band gaps of said plural waveguide layers of said n-type waveguide layer,
   wherein a difference between the band gap of each carrier blocking layer and the smallest value of the different band gaps of the respective waveguide layers is in the range of 85 meV–190 meV,
   wherein an energy difference between a band gap of a first ground state of the quantum well layers and the band gap of each of the carrier blocking layers is in the range of 300 meV–500 meV, and
   wherein a thickness of the carrier blocking layer is in the range of 5 nm–10 nm.

2. A semiconductor laser according to claim 1, wherein an emission wavelength of the semiconductor laser is 1.74 $\mu$m.

3. A semiconductor laser according to claim 1, wherein a thickness of each carrier blocking layer is in the range of 5 nm–10 nm.

4. A semiconductor laser according to claim 2, wherein a thickness of each carrier blocking layer is in the range of 5 nm–10 nm.

* * * * *